United States Patent
Bornefeld

(10) Patent No.: US 6,326,288 B1
(45) Date of Patent: Dec. 4, 2001

(54) CMOS COMPATIBLE SOI PROCESS

(75) Inventor: Ralf Bornefeld, Schalksmuehle (DE)

(73) Assignee: Elmos Semiconductor AG, Dortmund (DE)

( * ) Notice: Subject to any disclaimer, the term of this patent is extended or adjusted under 35 U.S.C. 154(b) by 0 days.

(21) Appl. No.: 09/610,886

(22) Filed: Jul. 6, 2000

(30) Foreign Application Priority Data

Jul. 6, 1999 (DE) ................................. 199 31 030
Oct. 27, 1999 (EP) ..................................... 99121430

(51) Int. Cl.$^7$ ................................................. H01L 21/28
(52) U.S. Cl. ........................... 438/585; 438/658; 438/660
(58) Field of Search ................................... 438/585, 658, 438/660, 194, 283, 291, 195, 589, 270, 259, 422, 404, 408, 409, 338; 257/355, 348, 356, 335

(56) References Cited

U.S. PATENT DOCUMENTS

| | | | |
|---|---|---|---|
| 4,578,128 | * | 3/1986 | Mundt et al. ................... 148/191 |
| 4,740,827 | * | 4/1988 | Niitsu et al. ..................... 357/42 |
| 5,053,350 | * | 10/1991 | Solomon ............................ 437/47 |
| 5,313,086 | * | 5/1994 | Jinbo .................................. 257/355 |
| 5,382,541 | * | 1/1995 | Bajor et al. ......................... 437/67 |
| 5,504,033 | * | 4/1996 | Bajor et al. ......................... 437/67 |
| 5,583,368 | * | 12/1996 | Kenney ............................ 257/621 |
| 5,622,880 | * | 4/1997 | Burr et al. ........................ 438/194 |
| 5,654,242 | * | 8/1997 | Komatsu ............................ 438/585 |
| 5,780,899 | * | 7/1998 | Hu et al. ............................. 257/335 |
| 5,801,089 | * | 9/1998 | Kenney ............................. 438/589 |
| 5,808,336 | * | 9/1998 | Miyawaki ........................ 257/315 |
| 6,020,250 | * | 2/2000 | Kenney ............................. 438/422 |
| 6,172,405 | * | 1/2001 | Shibata et al. .................... 257/371 |

* cited by examiner

*Primary Examiner*—Charles Bowers
*Assistant Examiner*—Laura M Schillinger

(57) ABSTRACT

In a method for producing an integrated circuit using a CMOS process, in particular a HV CMOS process, components are formed within troughs of different depths and of a first conductivity type, in particular N-type troughs, which are formed in a substrate layer of a second conductivity type opposite to the first conductivity type, in particular a P-type substrate. Further, a SOI wafer substrate is used that comprises a top substrate layer for forming the CMOS components, a lateral insulation layer provided beneath the substrate layer, and a support layer arranged beneath the insulation layer. The top substrate layer has a thickness less than or equal to the greatest trough depth of the CMOS process. The top substrate layer is provided with trench insulation areas down to the subjacent lateral insulation layer, and components are formed within the areas of the silicon layer intermediate the trench insulation areas using the CMOS process, wherein the troughs of the greatest depth (high-voltage N-type trough) extend to the insulation layer and fill the respective area entirely, and wherein components are integrated directly in the troughs of the greatest depth (high-voltage N-type trough), whereas, for components requiring a lesser trough depth, the troughs (logic N-type trough) surrounding these components are provided in troughs of the greatest depth (high-voltage N-type trough).

3 Claims, 2 Drawing Sheets

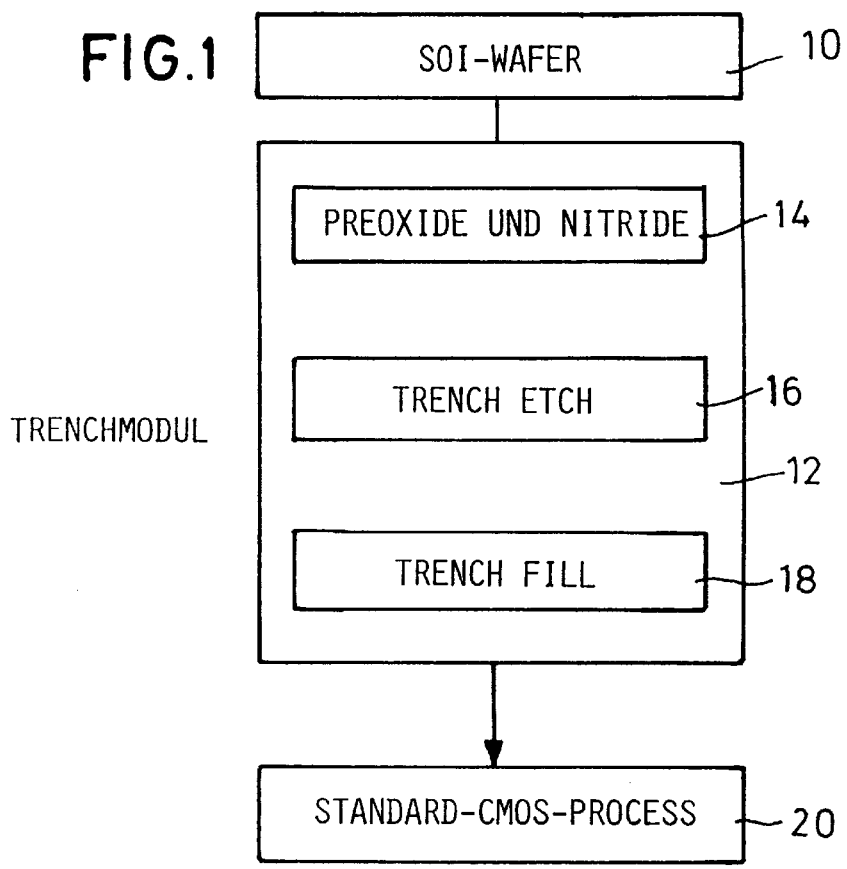
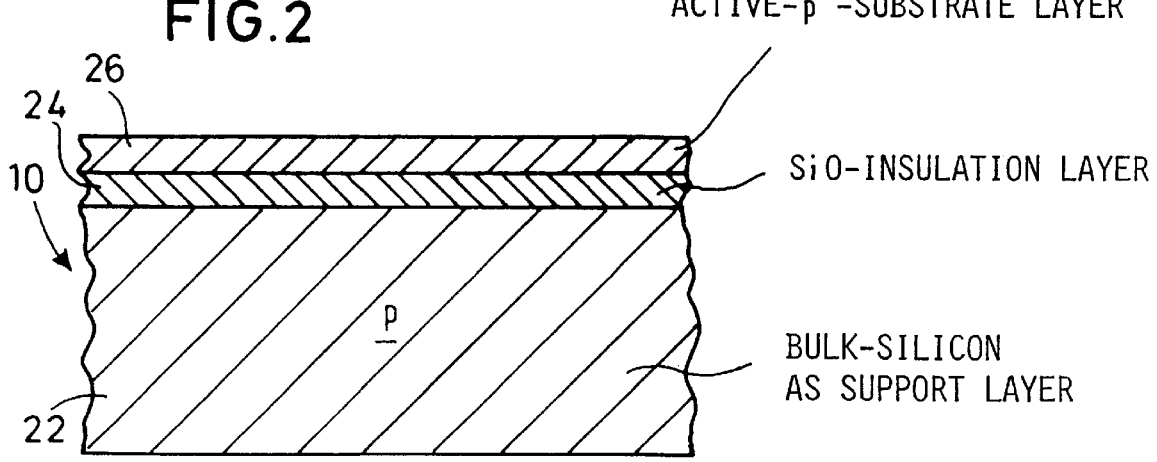

CMOS COMPATIBLE SOI PROCESS

FIELD OF THE INVENTION

The present invention relates to a method of producing an IC circuit using a CMOS process, in particular a HV-CMOS process, wherein components are formed within troughs of different depths and of a first conductivity type, in particular N-type troughs, which are formed in a substrate layer of a second conductivity type opposite to the first conductivity type, in particular a P-type substrate.

BACKGROUND ART

Since the beginning of the nineties, publications on SOI processes are available that can roughly be grouped in two categories: thick-film SOI processes, in which the active silicon layer has a thickness distinctly greater than 1 $\mu$m, and thin-film SOI processes, where substantially thinner active silicon layers to below 100 nm are used.

Whereas in thin-film SOI processes the electrical properties of the components differ considerably from standard processes, thick-film SOI processes basically are more suitable therefor.

By insulating circuit portions and/or components on thick-film SOI material, e.g., by using trenches, i.e. vertical insulation layers provided in the depth of the silicon layer for the lateral insulation of functional portions on a chip, considerable advantages over standard technologies may be achieved:

- parasitic effects such as latch-up are completely eliminated.
- Minorities generated in power switches cannot cause interferences in adjacent circuit portions (e.g. logic circuit portions).
- Free components, i.e. components uncoupled from the substrate, such as diodes, offer new possibilities in circuit design.

SUMMARY OF THE INVENTION

The invention is based on the principle idea of designing a SOI process (SOI=silicon on insulator) with a particularly simple process control, which is highly compatible with a standard CMOS process on standard silicon substrates. Here, the compatibility exists for both the process control and the electric behavior of the components.

The SOI process, wherein the substrate comprises a silicon layer disposed on an insulation layer, is intended to use advantages of the dielectric insulation of components and circuit portions for smart-power and high temperature applications.

It is desirable to apply a CMOS process, in particular a high voltage (HV) CMOS process, known per se, and therefore well controllable, to a so called bonded wafer, i.e. a SOI wafer. A bonded wafer comprises a top silicon layer in which the components are integrated. Below this silicon layer, an insulation layer, in particular of SiO, is arranged, underneath which a support layer is provided which, preferably, also is a silicon layer. This silicon wafer provided with the insulation layer is bonded to the support layer.

In a method for producing an integrated circuit using a CMOS process, in particular a HV CMOS process, components are formed within troughs of different depths and of a first conductivity type, in particular N-type troughs, which are formed in a substrate layer of a second conductivity type opposite to the first conductivity type, in particular a P-type substrate. Further, a SOI wafer substrate is used that comprises a top substrate layer for forming the CMOS components, a lateral insulation layer provided beneath the substrate layer, and a support layer arranged beneath the insulation layer. The top substrate layer has a thickness less than or equal to the greatest trough depth of the CMOS process. The top substrate layer is provided with trench insulation areas down to the subjacent lateral insulation layer, and components are formed within the areas of the silicon layer intermediate the trench insulation areas using the CMOS process, wherein the troughs of the greatest depth (high-voltage N-type trough) extend to the insulation layer and fill the respective area entirely, and wherein components are integrated directly in the troughs of the greatest depth (high-voltage N-type trough), whereas, for components requiring a lesser trough depth, the troughs (logic N-type trough) surrounding these components are provided in troughs of the greatest depth (high-voltage N-type trough).

The CMOS components produced on the SOI wafer substrate according to the present invention substantially behave like CMOS components formed in a standard substrate, if the conditions in the region below the components, i.e. in greater depths of the top substrate layer of the SOI wafer substrate do not vary substantially from the conditions in the standard substrate. This applies first to CMOS transistors that may be directly provided in the top substrate layer of the SOI wafer substrate without requiring any trough structures. Exemplary of a P-doped top SOI substrate layer are a high voltage NMOS (HV-NMOS) or a logic NMOS transistor. PMOS transistors, on the other hand, require an N-doped trough in the latter case. The depth of the N-type trough is greater for a HV-PMOS transistor than for a logic PMOS transistor. According to the present invention, the thickness of the top substrate layer of the SOI substrate is selected equal to the greater trough depth of the CMOS process. Thus, this wall extends directly to the insulation layer of the SOI wafer substrate, whereby the PN junction to the substrate, existing with a standard substrate, no longer exists. In the present invention, the deeper N-type trough located completely insulated in the SOI wafer substrate.

This N-type trough, as used for forming a HV-PMOS transistor in the SOI wafer substrate, may also be used to provide therein the shallower trough for a logic PMOS transistor. Again, the N-type trough of the PMOS transistor is insulated without a PN junction occurring in the depth of the SOI wafer substrate, since the deep N-type trough enclosing the shallow N-type trough for the logic PMOS transistor extends to the insulation layer of the SOI wafer substrate.

By matching the layer thickness of the top substrate layer of a SOI wafer substrate to the greatest trough depth of a CMOS process, it is possible to integrate CMOS components in the SOI wafer substrate, the behavior thereof substantially corresponding to the behavior of CMOS components integrated in a standard substrate. This is effected by the complete dielectric insulation of areas of different conductivity. To this end, it is necessary to completely insulate the troughs required for complementary elements, so as to avoid parasitic effects (e.g. bipolar effects). This leads to the thickness of the top substrate layer that must not be greater than the penetration depth of the troughs to be able to generate completely insulated areas of a complementary conductivity (see FIG. 3). In particular, there is no need to alter the CMOS process to be able to apply it to a SOI wafer substrate.

Based on a standard CMOS process, the invention suggests the use of thick-film SOI wafer substrates and the introduction of a vertical insulation, in particular in the form of trench insulation, as a pre-process. After the vertical, e.g., trench insulation has been effected, the standard CMOS process is run unaltered.

The essential aspect of the invention is that, on the process level, the SOI process thus established differs from the standard CMOS process only in the basic material used and in the trench module as the pre-process. After the trench insulation has been effected, the standard CMOS process develops unmodified, being fully compatible with the process presently running on standard substrates. This offers considerable advantages regarding manufacturing logistics.

Concerning the compatibility of the components, a similar degree of identity can be expected. This offers the advantage that circuits produced with present technologies can readily be transferred to SOI technology.

Finally, it should be noted that the method suggested is not only applicable to standard CMOS processes but also to any semiconductor manufacturing process.

BRIEF DESCRIPTION OF THE DRAWINGS

The following is a detailed description of the invention with reference to the accompanying drawings, in which FIG. 1 is a flow chart of the present manufacturing process with the trench module as a pre-stage for a standard CMOS process, FIG. 2 illustrates a SOI wafer substrate.

DESCRIPTION OF PREFERRED EMBODIMENTS

Figure 3:
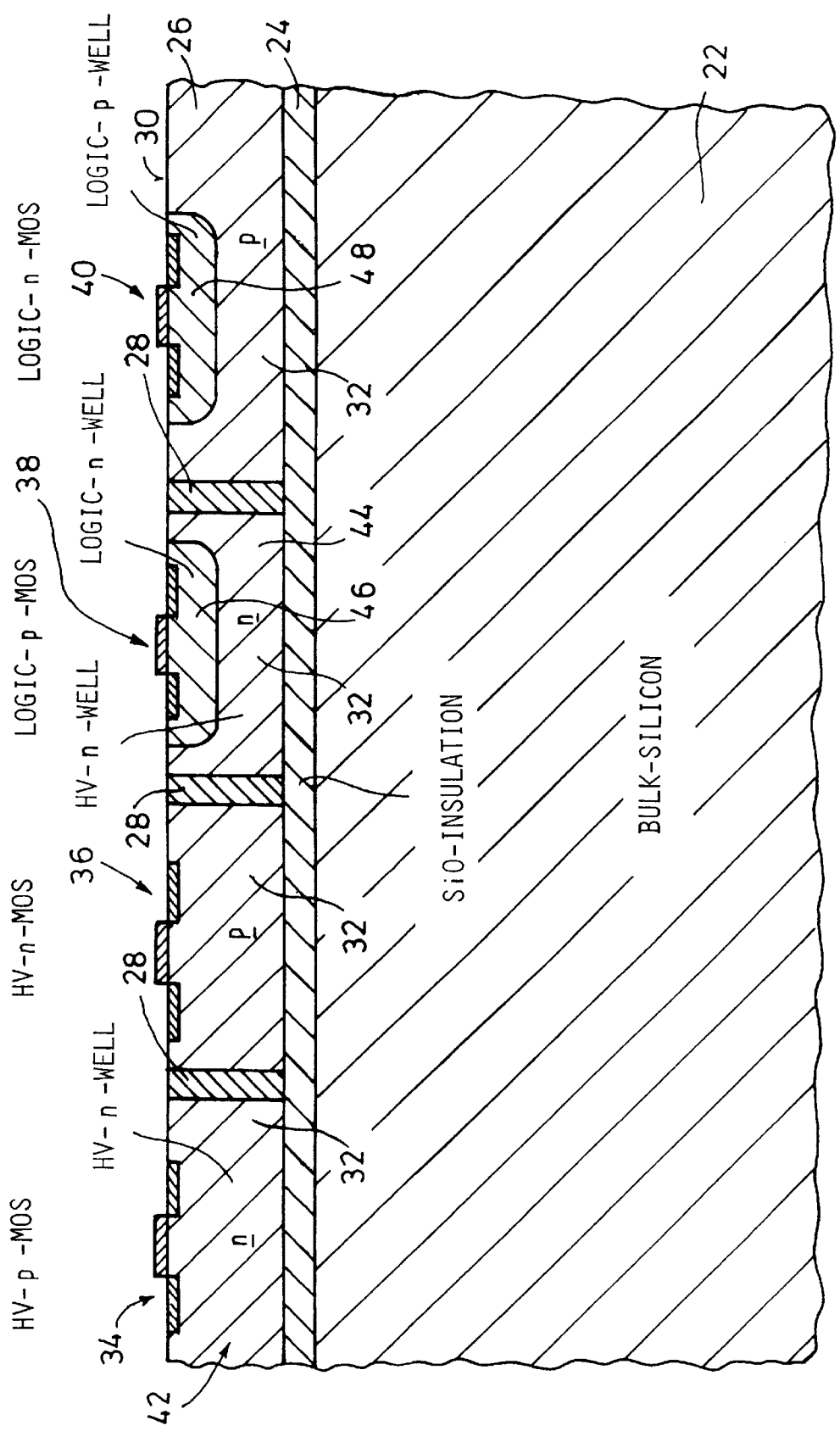
FIG. 3 illustrates examples of CMOS components in the active silicon layer of the SOI wafer substrate.

As illustrated in FIG. 1, a SOI Wafer 10 is subjected to a trenching process, the standard trench module 12 used comprises the step 14 of masking the SOI wafer 10 with a hard mask, the step 16 of etching trenches in the active silicon layer of the SOI wafer 10 and the step 18 of filling the trenches with an insulating material (e.g. $SiO_2$ or polysilicon). Thereafter, a standard CMOS process 20 is performed to form components in te active silicon layer of the SOI wafer 10.

FIG. 2 is a cross sectional view of the layered structure of the SOI wafer 10 prior to the trenching process and the standard CMOS process. The SOI wafer 10 has a bulk silicon layer 22 as the support layer with a lateral insulation layer 24 formed thereon. Arranged on the lateral insulation layer 24 is the active P-type silicon layer 26, in which the CMOS components are formed. The lateral insulation layer 24 serves to vertically insulate the active silicon layer 26 against the support layer 22.

The support layer 22 has a thickness of, e.g., about 500 $\mu$m. The thickness of the lateral insulation layer 24 is between 0.5 and 1.2 $\mu$m, while the active silicon layer 26 has a thickness from 1 to 10 $\mu$m.

FIG. 3 illustrates an upscaled cross section of the SOI wafer 10 after trench insulation and production of CMOS components. The active silicon layer 26 is provided with vertical insulation areas 28 extending from the top surface 30 of the active silicon layer 26 to the lateral insulation layer 24 and serving to insulate individual areas 32 of the active silicon layer 26 in the lateral direction. The lateral or widthwise extension of the vertical insulation areas 28 is between 0.6 and 2 $\mu$m. Then, in the mutually insulated areas 32, various components are formed using the standard CMOS process, such as a high voltage P-type MOS 34, a high voltage N-type MOS 36, a logic P-type MOS 38 and a logic N-type MOS 40. The high voltage P-type MOS 34 is provided in a diffused HV N-type trough 42, filling the entire area 32. Thus, this area 32 is fully dielectrically insulated. Accordingly, there is no PN junction of this area 32 towards the bordering vertical insulation areas 28 and the lateral insulation layer 24. Also the area 32, in which the logic P-type MOS 38 is formed, is completely filled by a HV N-type trough 44, so as to provide a shallow logic N-type trough 46 in this area 32, in which the logic P-type MOS 38 is located. The logic N-type MOS 40 is situated in a shallow logic P-type trough 48 provided in the insulated area 32. Finally, the HV N-type MOS 36 is provided in the insulated P-type area 32.

What is claimed is:

1. A method for producing an integrated circuit using a CMOS process, in particular a high voltage CMOS process, wherein components are formed within troughs of different depths and of a first conductivity type, in particular N-type troughs, which are formed in a substrate layer of a second conductivity type opposite to the first conductivity type, in particular a P-type substrate, the method being characterized in that an SOI wafer substrate (10) is used that comprises a top substrate layer (26) for forming the CMOS components (34–40), a lateral insulation layer (24) provided beneath the substrate layer, and a support layer (22) arranged beneath the insulation layer, the top substrate layer (26) has a thickness less than or equal to the greatest trough depth of the CMOS process, the top substrate layer (26) is provided with vertical insulation areas (28) down to the subjacent lateral insulation layer (24), and components (34–40) are formed within areas (32) of the substrate layer (26) intermediate the vertical insulation areas (28) using the CMOS process, wherein the troughs (42, 44) of the greatest depth (high-voltage N-type trough) extend to the insulation layer (24) and fill the respective area (32) entirely, and wherein components (34, 36) are integrated directly in the troughs (42, 44) of the greatest depth (high-voltage N-type trough), whereas, for components (38, 40) requiring a lesser trough depth, the troughs (46, 48) (logic N-type trough) surrounding these components are provided in troughs (42, 44) of the greatest depth (high-voltage N-type trough).

2. The method of claim 1, wherein the vertical insulation areas (28) are formed by vertically etching a trench into the substrate layer (26) down to the lateral insulation layer (24) and by successively providing or forming an insulating material in the trench.

3. An integrated circuit comprising CMOS components (34–40) produced in accordance with claim 1.

* * * * *